(12) United States Patent
Yamamoto et al.

(10) Patent No.: US 6,322,957 B1
(45) Date of Patent: Nov. 27, 2001

(54) LIGHT EXPOSURE METHOD

(75) Inventors: Masakuni Yamamoto, Yamato; Koichiro Nishikawa, Takasaki, both of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/275,444

(22) Filed: Mar. 24, 1999

(30) Foreign Application Priority Data

Mar. 26, 1998 (JP) ................................................ 10-098448

(51) Int. Cl.$^7$ ........................................................ G03F 7/22
(52) U.S. Cl. ............................ 430/394; 430/5; 430/311; 430/396; 359/483
(58) Field of Search ........................... 430/5, 311, 394, 430/396; 359/483

(56) References Cited

U.S. PATENT DOCUMENTS

| | | | |
|---|---|---|---|
| 5,122,895 | * 6/1992 | Takanashi | 359/247 |
| 5,459,000 | * 10/1995 | Unno | 430/5 |
| 5,673,103 | * 9/1997 | Inoue | 355/71 |
| 5,933,219 | * 8/1999 | Unno | 355/71 |

FOREIGN PATENT DOCUMENTS

| | | |
|---|---|---|
| 62-50811 | 3/1987 | (JP) . |
| 4-267515 | 9/1992 | (JP) . |
| 8-179493 | 7/1996 | (JP) . |
| 10-70060 | * 3/1998 | (JP) . |
| 11-283911 | * 10/1999 | (JP) . |

* cited by examiner

*Primary Examiner*—Mark F. Huff
*Assistant Examiner*—Nicole Barreca
(74) *Attorney, Agent, or Firm*—Fitzpatrick, Cella, Harper & Scinto

(57) ABSTRACT

A method of exposure to a light pattern containing a first strip-shaped portion extending in a first direction and a second strip-shaped portion extending in a second direction comprises steps of placing, on a light-receiving face, a first mask having a strip-shaped slit corresponding to the first strip-shaped portion extending in a first direction of the pattern, projecting, to the first mask, a first linearly polarized light beam polarized in the second direction to irradiate the light-receiving face through the slit of the first mask, removing the first mask from the light-receiving face, and placing, on the light-receiving face, a second mask having a strip-shaped slit corresponding to the second strip-shaped portion extending in a second direction of the pattern and projecting, to the second mask, a second linearly polarized light beam polarized in the first direction to irradiate the light-receiving face through the slit of the second mask.

5 Claims, 5 Drawing Sheets

LIGHT EXPOSURE METHOD

BACKGROUND OF THE INVENTION

1. Field of the Invention

The present invention relates to a method of light exposure applicable to semiconductor lithography, or a like process, particularly to a method of light exposure utilizing evanescent light.

2. Related Background Art

In recent years, techniques for making a fine semiconductor device are being developed rapidly. Demagnifying light projection methods are employed for transferring a pattern of IC (integrated circuit) or the like by light exposure. In such a method, a mask is prepared for pattern formation; this mask is illuminated by a light projection system; and the light penetrating through the mask is focused by a demagnification lens on a light-receiving base plate to transfer the pattern on the mask onto the light-receiving base plate.

In this method, the minimum dimension of the pattern is limited by occurrence of light diffraction. The limit is about 0.6 $\lambda$/NA (where $\lambda$ is light wavelength, and NA is numerical aperture of the lens).

For obtaining a smaller pattern size, a phase shift light projection method is disclosed in Japanese Patent Application Laid-Open No. 62-50811. For lowering the resolution limit, an oblique light projection method is disclosed in Japanese Patent Application Laid-Open No. 4-267515.

Even with the above techniques and a stepper employing an excimer laser light source, the pattern size cannot be made smaller than about 0.15 $\mu$m at present.

For lowering the limit caused by light diffraction, a method is disclosed in Japanese Patent Publication Gazette No. 8-179493 (1987), in which so-called evanescent light leaking from a dielectric material is utilized to transfer a pattern of 0.15 $\mu$m or finer.

The light exposure employing the evanescent light is explained by reference to FIG. 1. In FIG. 1, laser beam 30 is introduced at such an incident angle that the laser beam is totally reflected as reflected laser beam 31 at the bottom face of prism 32. A mask 34 is provided on glass base plate 33. This mask 34 is made from an electroconductive material such as chromium, and serves as a light-intercepting film. Photosensitive material (photoresist) 36 is applied onto transfer-receiving base plate 37. Glass base plate 33 carrying mask 34 is closely attached to prism 32 with interposition of spacer 38. Thereby, evanescent light 35 leaks through openings of mask 34. When photosensitive material 36 applied on transfer-receiving base plate 37 is brought close thereto to expose it to leaking light 35, a latent image is formed in the photosensitive material by photopolymerization, crosslinking reaction, or a like process. This latent image is developed and fixed to transfer the pattern of the openings of mask 34 to form a fine pattern of not larger than 0.2 $\mu$m.

The above prior art techniques, however, utilize a circularly polarized laser beam introduced in one direction, so that they have a disadvantage that the transfer accuracy differs between a vertical pattern and a lateral pattern. More specifically, the mask pattern for an IC or the like is generally constituted of slit-shaped openings arranged perpendicularly to each other, vertically and laterally. Therefore, when light is introduced to a fine slit of not more than the wavelength of the light, the behavior of the light leaking from the slit-shaped openings is different between the linearly polarized light introduced perpendicularly to the length direction of the opening and that introduced parallel thereto. The linearly polarized light introduced perpendicularly to the length direction of the slit leaks in the same shape as the slit, whereas the linear polarized light introduced parallel thereto leaks out along the edge of the opening, not to transfer precisely the pattern of the mask.

In the above prior art techniques, a triangular prism is used. In the triangular prism, the light reflected at the bottom face leaves the prism to the air through the prism face nearly perpendicular to the light path, so that a part of the light to be emitted outside is reflected by the prism face to return to the bottom to cause interference with the original incident light, thereby disturbing the uniform distribution of the evanescent light, disadvantageously.

SUMMARY OF THE INVENTION

An object of the present invention is to provide a method of light exposure which solves the aforementioned problems of prior art techniques and is capable of transferring optically a pattern containing strip-shaped portions extending in different directions with high precision.

In a first embodiment of the present invention, there is provided a method of exposure to a light pattern containing a first strip-shaped portion extending in a first direction and a second strip-shaped portion extending in a second direction, the method comprising steps of placing, on a light-receiving face, a first mask having a strip-shaped slit corresponding to the first strip-shaped portion extending in a first direction of the pattern; projecting, to the first mask, a first linearly polarized light beam polarized in the second direction to irradiate the light-receiving face through the slits of the first mask; removing the first mask from the light-receiving face, and placing, on the light-receiving face, a second mask having a strip-shaped slit corresponding to the second strip-shaped portion extending in a second direction of the pattern; and projecting, to the second mask, a second linearly polarized light beam polarized in the first direction to irradiate the light-receiving face through the slit of the second mask.

In a second embodiment of the present invention, there is provided a method of exposure to a light pattern containing a first strip-shaped portion extending in a first direction and a second strip-shaped portion extending in a second direction, the method comprising steps of placing, on a light-receiving face, a first mask having a strip-shaped slit corresponding to the first strip-shaped portion extending in a first direction of the pattern; projecting, to the first mask, a first linearly polarized light beam polarized in the first direction to irradiate the light-receiving face through the slit of the first mask; removing the first mask from the light-receiving face, and placing, on the light-receiving face, a second mask having a strip-shaped slit corresponding to the second strip-shaped portion extending in a second direction of the pattern; and projecting, to the second mask, a second linearly polarized light beam polarized in the second direction to irradiate the light-receiving face through the slits of the second mask.

In any of the above embodiments, preferably the first linearly polarized light beam and the second linearly polarized light beam are projected to the first mask or the second mask through an optical block having a bottom face in close contact with the mask at an incident angle of the light beam to cause total reflection at the bottom face, and the light-receiving face is exposed to the evanescent light passing through the slit of the first or second mask.

The polarization direction of the linearly polarized light means the vibration direction of the electric field vector of the light. In the case where a linearly polarized light beam is introduced at a prescribed incident angle not perpendicular to the irradiated face as above, the linearly polarized light beam polarize d in a first direction means such a polarized light beam that the projected component of vibration direction of the electric field vector of the linearly polarized light is parallel to the above first direction. On the other hand, the linearly polarized light beam polarized in a second direction means such polarized light that the projected component of vibration direction of the electric field vector of the linearly polarized light is parallel to the above second direction.

In the case where the first and second linearly polarized light beams are introduced at a prescribed angle not perpendicular to an irradiated face, preferably a first imaginary plane containing the optical axis of the first linearly polarized light beam and the normal line of the light-receiving face and a second imaginary plane containing the optical axis of the second linearly polarized light beam and the normal line of the light-receiving face are perpendicular to each other.

Generally, linearly polarized light which has the electric field vector vibration in the direction of the plane containing the optical axis of the light and the normal line of the incidence face is called a TE wave (transverse electric wave), and linearly polarized light which has the electric field vector vibration in the direction of the incidence plane is called a TM wave (transverse magnetic wave). Therefore, when a linearly polarized light polarized in a first direction is introduced at a prescribed angle not perpendicular to the irradiated face and the cross-line of the imaginary plane containing the optical axis of this linearly polarized light beam and the normal line of the irradiated face and the irradiated face is parallel to the first direction, the linearly polarized light is the TE wave. On the other hand, when a linearly polarized light polarized in a first direction is introduced at a prescribed angle not perpendicular to the irradiated face and the cross-line of the imaginary planes containing the optical axis of this linearly polarized light beam and the normal line of the irradiated face and the irradiated face is perpendicular to the first direction, the linearly polarized light is the TM wave.

DESCRIPTION OF THE PREFERRED EMBODIMENT

The present invention is described below in detail by reference to the drawings.

Figure 1:
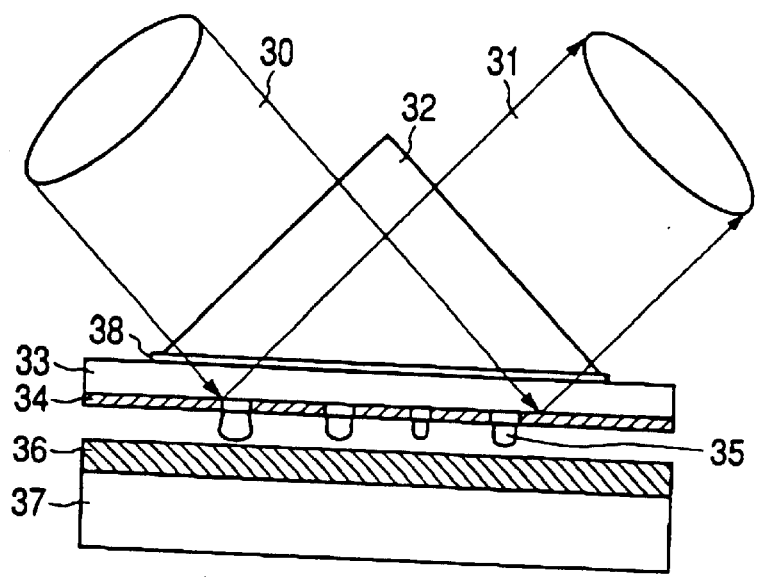
FIG. 1 is a schematic sectional view showing a method of light exposure of the prior art employing an evanescent wave.
Figure 2:
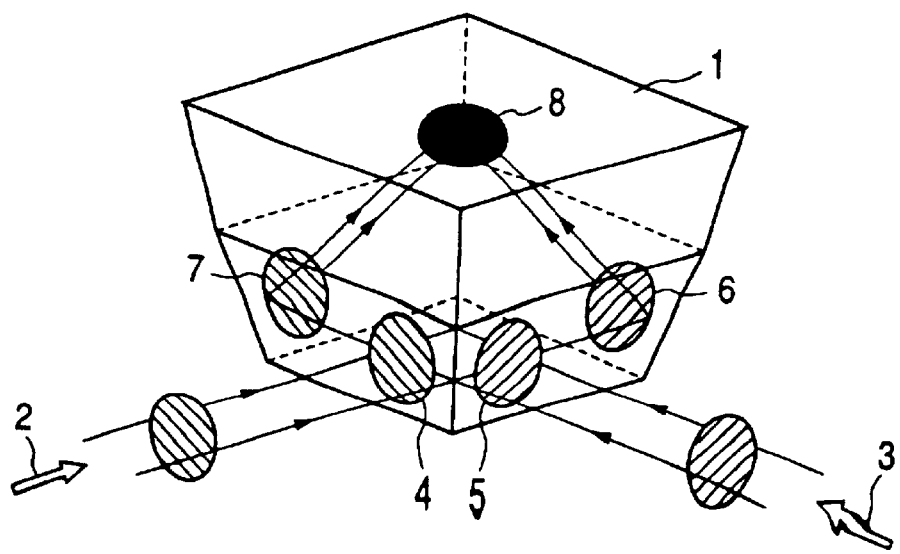
FIG. 2 is a schematic perspective view of an optical block employed in the light exposure method of the present invention and irradiation light.

FIG. 2 is a schematic perspective view of an optical block employed in the light exposure method of the present invention. In FIG. 2, the numeral 1 indicates the main body of the optical block. The numerals 2 and 3 indicate parallel luminous fluxes of linearly polarized light. The two parallel luminous fluxes 2, 3 may be formed by separating one luminous flux emitted from one light source into two fluxes by switching over with a shutter or the like, or may be derived from two separate light sources (not shown in the drawing). Parallel light fluxes 2, 3 are introduced respectively into optical block 1 through incidence face 4 or 5, and are reflected by reflection face 6 or 7 at a reflectivity of about 100%. Reflection faces 6, 7 are mirror faces formed by coating with aluminum or the like. The parallel luminous fluxes reflected at reflection faces 6, 7 are introduced respectively to nearly the same region on stage face 8. The respective luminous fluxes are introduced at an incident angle to be totally reflected at stage face 8.

Figure 3A:
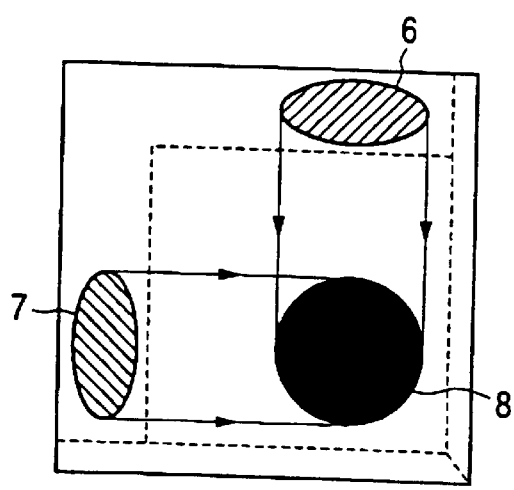
FIG. 3A is a top view and FIGS. 3B and 3C are side views of the optical block shown in FIG. 2.
Figure 3B:
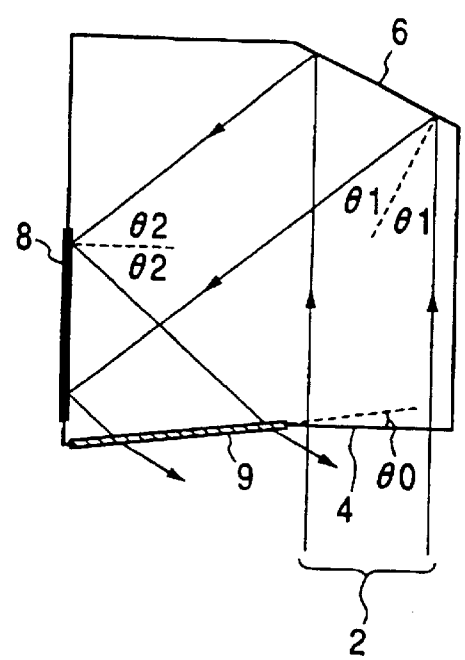
Figure 3C:
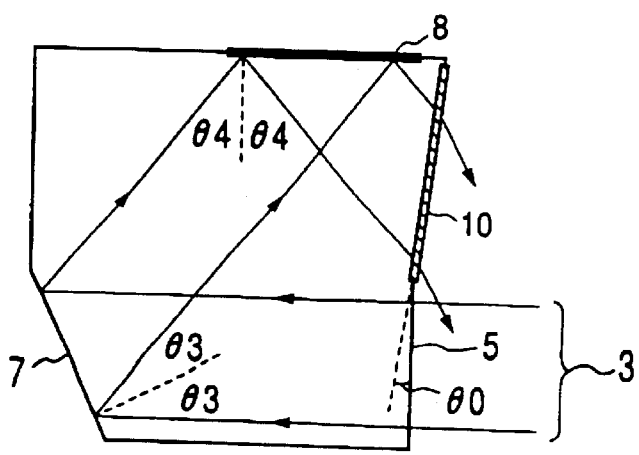

FIGS. 3A to 3C explain optical block 1 in FIG. 2 in more detail. FIG. 3A is a top view of optical block 1, FIGS. 3B and 3C are side views of optical block 1 shown in FIG. 3A.

In FIG. 3B, parallel luminous flux 2 of the linearly polarized light penetrates through incidence face 4, and is reflected by reflection face 6 at an angle, for example, of $\theta_1=22.5°$. The reflected luminous flux is introduced to stage face 8 and is totally reflected at an angle, for example, of $\theta_2=45°$. In this process, evanescent light is produced on the stage face. The totally reflected luminous flux 9 is led out of the optical block through face 9 having antireflection coating. The luminous flux introduced to face 9 can be led out from the optical block without total reflection, for example, by tilting the face 9 relative to incidence face 4, for example, at an angle of $\theta_0=15°$.

Similarly, in FIG. 3C, parallel luminous flux 3 of the linearly polarized light penetrates through incidence face 5, and is reflected by reflection face 7 at an angle, for example, of $\theta_3=22.5°$. The reflected luminous flux is introduced to stage face 8, and is totally reflected at an angle of $\theta_4=45°$. In this process, evanescent light is produced on the stage face. The totally reflected luminous flux 10 is led out of the optical block through face 10 having antireflection coating. The luminous flux introduced to face 9 can be led out from the optical block without total reflection by tilting face 9 relative to incidence face 4 at an angle, for example, of $\theta_0=15°$.

As understood from FIG. 3A, a mask is placed on stage face 8. The optical block is designed so that planes containing one of the optical axes of the two luminous fluxes coming from reflection faces 6, 7 and the normal line of stage face 8 are nearly perpendicular to each other.

Figure 4:
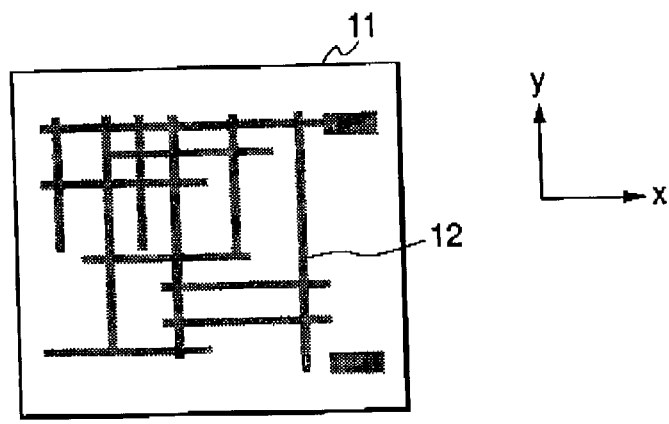
FIG. 4 is a plan view of a mask employed in a light exposure of a prior art technique.
Figure 5A:
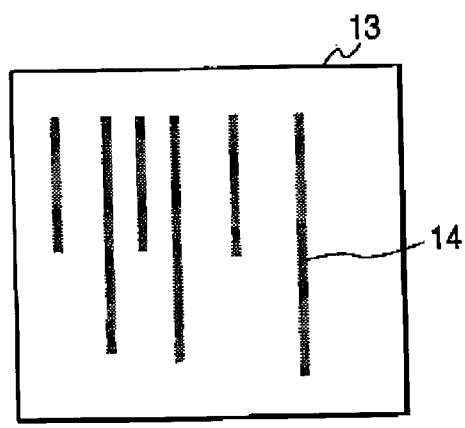
FIGS. 5A and 5B are plan views of two masks employed in the present invention.
Figure 5B:
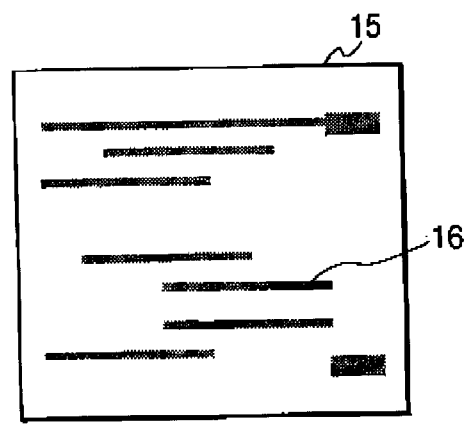

FIG. 4 and FIGS. 5A and 5B show respectively a plan view of a mask base plate employed in the present invention. In this description, the mask is assumed to be used for IC production.

FIG. 4 shows a mask pattern 11 similar to conventional ones, the IC pattern being constituted of a combination of slit-shaped openings 12 in an x-axis direction and a y-axis direction perpendicular to each other. Here the width of the openings is assumed to be smaller than the wavelength of the light employed for the irradiation. The pattern 13 of FIG. 5A comprises slit-shaped openings 14 extending in the y-axis direction taken out from the pattern of FIG. 4, and the pattern 15 of FIG. 5B comprises the slit-shaped openings 16 in the x-axis direction thereof.

In the present invention, the mask patterns 13 of FIG. 5A having slit-shaped openings 14 in the y-axis direction and the mask patterns 15 of FIG. 5B having slit openings 16 in the x-axis direction are separately printed for formation of one IC pattern. In this process, the relation of the direction of the linear polarization of the evanescent light and the length direction of the openings are kept unchanged, and the printing of the x-direction pattern and the y-direction pattern are conducted under the same conditions to prevent irregularity of the printing. For example, the vibration direction of the electric field of the linearly polarized light is adjusted to be perpendicular to or parallel to the length direction of the openings, whereby the distribution of the evanescent light leaking from the openings distributes characteristically to one of the light polarization states. When it is perpendicular, the light leaks in the same shape as the shape of the slots, whereas when it is parallel, the light diffuses out of the edge of the openings. Therefore, the direction is preferably perpendicular in order to transfer the same shape as the openings. However, a parallel direction may be employed by selecting the mask pattern according to a phase mask method, or the like.

FIGS. 6A, 6B, 7, and 8 explain specifically the exposure method of the present invention.

Figure 6A:
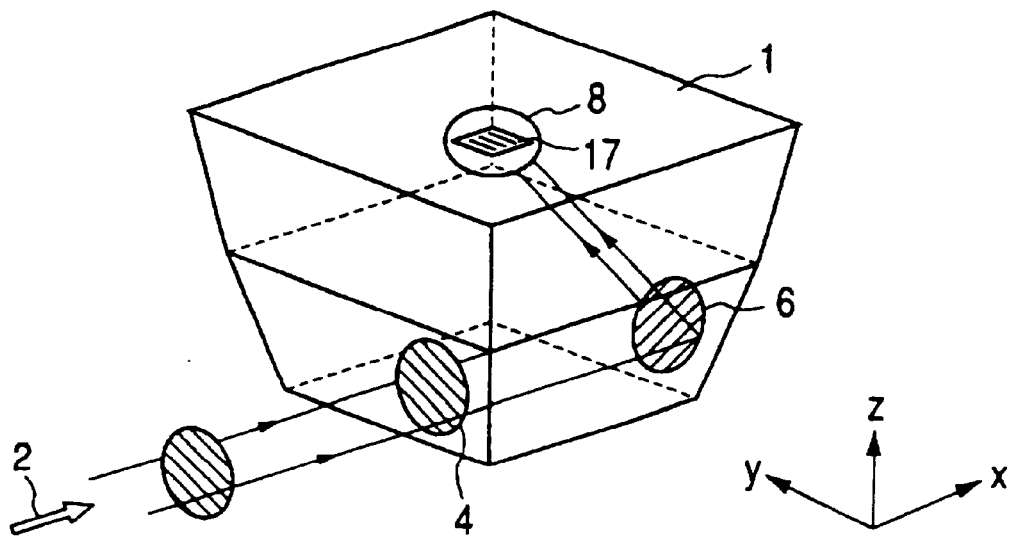
FIGS. 6A and 6B are schematic perspective views for explaining a process for light exposure of the present invention.
Figure 6B:
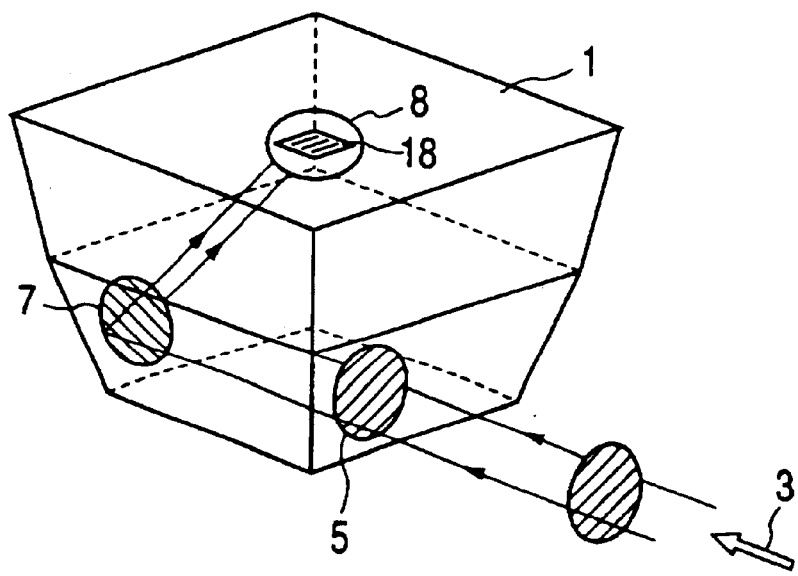

In FIGS. 6A and 6B, the polarization of the projected linear polarized light is directed to the z direction.

In FIG. 6A, mask base plate 17 has a mask pattern of slit-shaped openings with the length direction directed to the y axis. Parallel luminous flux 2 of the linearly polarized light beam polarized in the z axis direction transmits through incidence face 4, reflected by reflection face 6, introduced to stage face 8, and reflected there totally. Thus, the polarization direction of the projected light becomes perpendicular to the length direction of the slit-shaped openings of mask base plate 17. In this state, the evanescent light leaking from the openings is employed to transfer the mask pattern.

In FIG. 6B, mask base plate 18 has a mask pattern of slit-shaped openings with the length direction directed to the x axis. Similarly as above, parallel luminous flux 3 of the linearly polarized light beam polarized in the z axis direction is allowed to pass through incidence face 5, reflected by reflection face 7, introduced to stage face 8, and reflected there totally. Thus, the polarization direction of the projected light becomes perpendicular, similarly as above, to the length direction of the slit-shaped openings of mask base plate 18. In this state, the evanescent light leaking from the openings is employed to transfer the mask pattern.

One printing of one pattern is conducted by the successive two times of slit image transfer as above.

In this embodiment, both of light fluxes 2, 3 introduced to the optical block are linearly polarized in the z direction. Therefore, the luminous flux reflected by reflection faces 6, 7 have respectively a vibration direction of the electric field vector within the plane containing the normal line of stage face 8 and the optical axis. Therefore, in both of FIG. 6A and FIG. 6B, the linear polarization light introduced to stage face 8 is a TE wave.

In the case where the projected luminous flux 2 is polarized in the y-axis direction, and projected luminous flux 3 is polarized in the x-axis direction, mask 18 is employed in FIG. 6A, and mask 17 is employed in FIG. 6B.

The arrangement of the mask and the photosensitive material is described by reference to FIG. 7 and FIG. 8.

Figure 7:
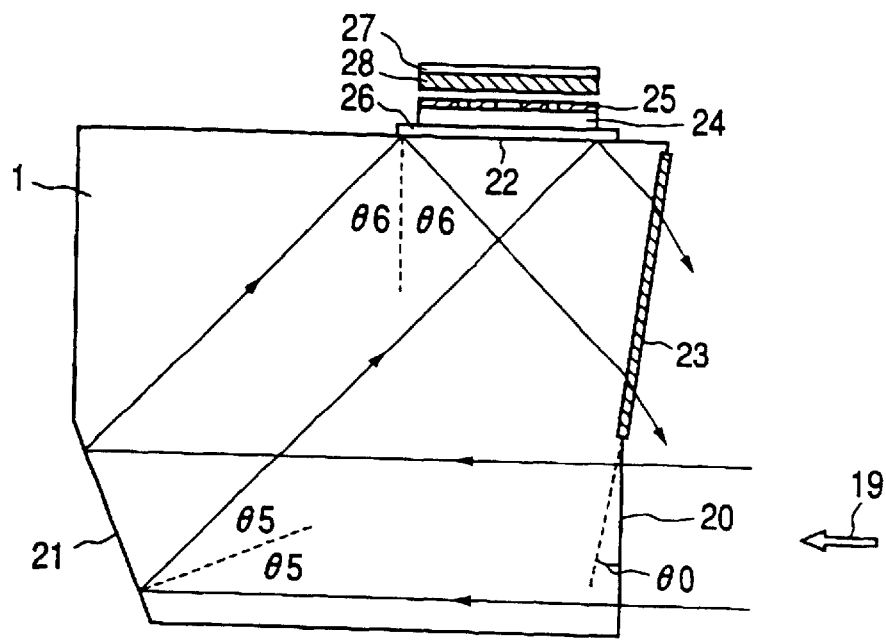
FIG. 7 is a schematic sectional view showing an arrangement of a mask and a photosensitive material in the light exposure of the present invention.

In FIG. 7, the mask base plate is prepared by forming a mask pattern 25 from a metal like chromium on glass base plate 24. The mask base plate is placed on stage face 22 of optical block 1 with interposition 26 of a gap or of a contacting material like a matching oil filled there. This embodiment employs mask 17 mentioned in FIG. 6A. Irradiating light 19 is introduced through incidence face 20, reflected by reflection face 21 at a reflection angle θ5 (e.g., 22.5°), and introduced to stage face 22 at an incident angle θ6 (e.g., 45°). The length direction of the slit-shaped openings of the mask pattern is directed perpendicular to the polarization direction of the irradiating light. The light introduced to the stage face travels to glass base plate 24, and is totally reflected at the face where mask pattern 25 is attached. The reflected light is emitted to the outside of optical block 1 through face 23 coated for antireflection. Face 23 is tilted as mentioned above at an angle θ0 of 15° relative to incidence face 20. Base plate 27 having a photosensitive material 28 applied thereon is placed closely with a gap onto mask pattern 25 with registration of photosensitive material 28 to mask pattern 25 by means of a registration mechanism not shown in the drawing. Thereby the photosensitive material is exposed to leaking evanescent light in correspondence with mask pattern 25 to transfer the pattern. Subsequently, mask 17 is replaced by mask 18. The pattern transfer is conducted with irradiating light introduced from another direction in the same manner as explained by reference to FIG. 6B. Thus printing of one pattern is completed.

Figure 8:
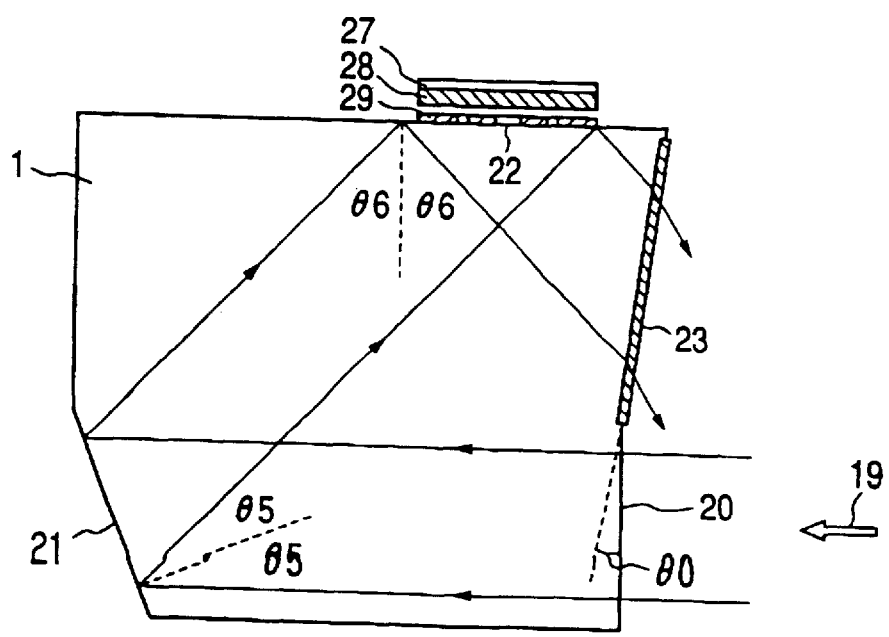
FIG. 8 is a schematic sectional view showing another arrangement of a mask and a photosensitive material in the light exposure of the present invention.

In FIG. 8, mask pattern 29 is directly attached onto stage face 22 of optical block 1. In this embodiment, the irradiation in two directions is conducted by use of separate optical blocks, whereby the shape of the optical blocks can be simplified. Other operations are the same as that mentioned by reference to FIG. 7.

What is claimed is:

1. A method of exposing first and second masks to a light pattern containing a first strip-shaped portion extending in a first direction and a second strip-shaped portion extending in a second direction, said method comprising steps of:

placing, on a light-receiving face, a first mask having a strip-shaped slit corresponding to the first strip-shaped portion extending in a first direction of the pattern in a manner as to make the first mask come closely into contact with the light-receiving face;

placing an optical block in a manner so as to make a bottom face of the optical block come closely into contact with the first mask;

projecting, to the first mask, a first linearly polarized light beam polarized in the second direction at an angle enabling the first linearly polarized light beam to totally reflect from the bottom face of the optical block, to irradiate the light-receiving face with evanescent light passing through the slit of the first mask;

removing the first mask from the light-receiving face, and placing, on the light-receiving face, a second mask having a strip-shaped slit corresponding to the second strip-shaped portion extending in a second direction of the pattern in a manner so as to make the second mask come closely into contact with the light-receiving face;

placing the optical block in a manner so as to make a bottom face of the optical block come closely into contact with the second mask; and projecting, to the second mask, a second linearly polarized light beam polarized in the first direction at an angle enabling the second linearly polarized light beam to totally reflect from the bottom face of the optical block, to irradiate the light-receiving face with evanescent light passing through the slit of the second mask.

2. The method according to claim 1, further comprising projecting the first and second linearly polarized light beams from respective directions perpendicular to each other to the optical block.

3. The method of exposure according to claim 1, wherein the first and second linearly polarized light beams are comprised of a transverse electric wave, respectively.

4. The method of exposure according to claim 1, wherein the optical block comprises a first optical block having the first mask directly attached to the bottom thereof, and a second optical block having the second mask directly attached to the bottom thereof.

5. The method of exposure according to claim 1, wherein the optical block is a polygonal optical block having first and second incidence faces for introducing the first and second linear polarized light respectively, and first and second reflection faces for reflecting the first and second linearly polarized light beams toward the bottom face respectively.

* * * * *

UNITED STATES PATENT AND TRADEMARK OFFICE
CERTIFICATE OF CORRECTION

PATENT NO. : 6,322,957 B1 Page 1 of 1
DATED : November 27, 2001
INVENTOR(S) : Masakuni Yamamoto et al.

It is certified that error appears in the above-identified patent and that said Letters Patent is hereby corrected as shown below:

Column 2,
Line 62, "con tact" should read -- contact --.

Column 3,
Line 4, "polarize d" should read -- polarized --.
Line 35, "planes" should read -- plane --.

Column 5,
Line 28, "z axis" should read -- z-axis --
Line 38, ""z axis" should read -- z-axis --.
Line 48, "of" should be deleted.
Line 53, "of" should be deleted.

Signed and Sealed this

Fourth Day of June, 2002

*Attest:*

*Attesting Officer*

JAMES E. ROGAN
*Director of the United States Patent and Trademark Office*